US012793529B2

(12) United States Patent
Lee

(10) Patent No.: US 12,793,529 B2
(45) Date of Patent: Nov. 10, 2026

(54) BATTERY ALARM SYSTEM FOR WIRELESS SENSORS AND METHOD THEREOF

(71) Applicant: SUNHST CO., LTD., Ulsan (KR)

(72) Inventor: Jin Yong Lee, Ulsan (KR)

(73) Assignee: SUNHST CO., LTD., Ulsan (KR)

( * ) Notice: Subject to any disclaimer, the term of this patent is extended or adjusted under 35 U.S.C. 154(b) by 8 days.

(21) Appl. No.: 18/873,749

(22) PCT Filed: Jun. 23, 2023

(86) PCT No.: PCT/KR2023/008783
§ 371 (c)(1),
(2) Date: Dec. 11, 2024

(87) PCT Pub. No.: WO2023/249460
PCT Pub. Date: Dec. 28, 2023

(65) Prior Publication Data

US 2025/0371961 A1 Dec. 4, 2025

(30) Foreign Application Priority Data

Jun. 24, 2022 (KR) ........................ 10-2022-0077194

(51) Int. Cl.
*G08B 21/18* (2006.01)
*G01R 31/367* (2019.01)
*G01R 31/3835* (2019.01)

(52) U.S. Cl.
CPC ......... *G08B 21/185* (2013.01); *G01R 31/367* (2019.01); *G01R 31/3835* (2019.01)

(58) Field of Classification Search
CPC ...... G08B 21/185; G08B 5/22; G08B 21/182; G08B 25/14; G01R 31/367;
(Continued)

(56) References Cited

U.S. PATENT DOCUMENTS 6,817,757 B1 * 11/2004 Wallace ................. G01K 1/024
374/E1.004
11,374,587 B1 * 6/2022 Huynh .................... H03M 1/46
(Continued)

FOREIGN PATENT DOCUMENTS

JP 2015-511309 A 4/2015
JP 2015-192188 A 11/2015
(Continued)

OTHER PUBLICATIONS

International Search Report for PCT/KR2023/008783 mailed Oct. 18, 2023 from Korean Intellectual Property Office.

*Primary Examiner* — Curtis J King
(74) *Attorney, Agent, or Firm* — Revolution IP, PLLC

(57) ABSTRACT

The present invention relates to a battery alarm system for wireless sensors and a method thereof, the battery alarm system for sensors, according to an embodiment of the present invention, comprising: a wireless control device for communicating with a plurality of wireless sensors that monitor the status of a random space or equipment so as to receive status data related to the battery status of each wireless sensor; and a sensor monitoring device for matching the received status data to identification information of each wireless sensor to store and manage same, providing an error alarm to an administrator terminal device that manages the plurality of wireless sensors, and, in case the administrator terminal device selects the error alarm provided thereto, providing a monitoring screen for identifying the location of the wireless sensor at which an error has occurred.

4 Claims, 6 Drawing Sheets

(58) Field of Classification Search
CPC ............ G01R 31/3835; G01R 31/2829; G01R 31/3646; G01R 19/1659; G01R 31/371; H01M 10/488; H01M 10/48; H01M 50/247; Y02E 60/10
See application file for complete search history.

(56) References Cited

U.S. PATENT DOCUMENTS

| | | | | |
|---|---|---|---|---|
| 11,763,657 | B2 * | 9/2023 | Bistany | G01K 13/00 340/627 |
| 12,159,984 | B1 * | 12/2024 | Shaller | H01M 10/482 |
| 2010/0124209 | A1 * | 5/2010 | In | H04B 7/2656 370/337 |
| 2011/0148349 | A1 * | 6/2011 | Kim | G01D 21/00 320/108 |
| 2012/0119907 | A1 * | 5/2012 | Teuchert | G08B 5/006 340/541 |
| 2013/0335219 | A1 * | 12/2013 | Malkowski | G08B 13/2491 340/539.22 |
| 2015/0257643 | A1 * | 9/2015 | Watson | A61B 5/02438 600/324 |
| 2015/0318725 | A1 * | 11/2015 | Brockman | B60R 16/033 320/162 |
| 2016/0050514 | A1 * | 2/2016 | Skocypec | H04W 52/0261 455/68 |
| 2016/0317131 | A1 * | 11/2016 | Schwartz Klessel | A61B 8/54 |
| 2016/0353385 | A1 * | 12/2016 | Skocypec | H04W 4/021 |
| 2017/0156101 | A1 * | 6/2017 | Takahashi | H04L 5/0055 |
| 2017/0170682 | A1 * | 6/2017 | McConkey | H02J 7/35 |
| 2019/0322369 | A1 * | 10/2019 | Weisfelner | G08B 5/223 |
| 2020/0083722 | A1 * | 3/2020 | Zhang | H02J 7/40 |
| 2021/0256837 | A1 * | 8/2021 | DeQuarto | G08C 17/02 |
| 2022/0266709 | A1 * | 8/2022 | Hinata | B60R 11/02 |
| 2023/0141979 | A1 * | 5/2023 | Rigelsford | H01M 10/4257 429/61 |
| 2023/0144900 | A1 * | 5/2023 | Deng | G01R 31/3648 429/7 |
| 2023/0145119 | A1 * | 5/2023 | Love | G01N 33/492 340/500 |
| 2024/0302448 | A1 * | 9/2024 | Kasselman | G01R 31/367 |
| 2025/0131816 | A1 * | 4/2025 | S | G08B 29/181 |

FOREIGN PATENT DOCUMENTS

| | | | |
|---|---|---|---|
| JP | 2017-120491 | A | 7/2017 |
| KR | 10-1098042 | B1 | 1/2012 |
| KR | 10-1143343 | B1 | 5/2012 |
| KR | 10-1652461 | A | 9/2016 |
| KR | 10-1652461 | B1 | 9/2016 |
| KR | 10-2019-0111359 | A | 10/2019 |
| KR | 10-2021-0084094 | A | 7/2021 |
| KR | 10-2022-0007939 | A | 1/2022 |

* cited by examiner

BATTERY ALARM SYSTEM FOR WIRELESS SENSORS AND METHOD THEREOF

CROSS REFERENCE TO PRIOR APPLICATIONS

This application is a National Stage Application of PCT International Patent Application No. PCT/KR2023/008783 filed on Jun. 23, 2023, under 35 U.S.C. § 371, which claims priority to Korean Patent Application No. 10-2022-0077194 filed on Jun. 24, 2022, which are all hereby incorporated by reference in their entirety.

TECHNICAL FIELD

The present invention relates to a wireless sensor battery alarm system and method, and more specifically, to a wireless sensor battery alarm system and method in which, in order to prevent malfunctions and safety incidents of workers due to battery discharge in an environment using a wireless sensor, a level of a sensor battery is measured to provide a notification function when the measured level decreases to a certain voltage or less.

BACKGROUND ART

A wireless sensor network (WSN) is connected to an external network through a network system to allow information input through various sensors to be processed and managed in real time. The ultimate purpose of such wireless sensor network systems is to provide computing and communication functions to all things, thereby implementing an environment in which communication is possible anytime, anywhere, and irrespective of networks, devices, or services. The configuration of such a wireless sensor network system includes a sensor configured to detect recognition information about a thing or surrounding environment information in real time, a sensor node which includes a communication module, a sensor field which includes a set of sensor nodes, a sink node which receives and collects information collected from the sensor field and provides the collected information to users or controls the sensor nodes through a network system such as the Internet, and a gateway which routes information transmitted from the sink node and transmits the information to a management server through a broadband network. Here, the sensor node and the sink node may be connected through existing infrastructures such as satellite communications, wireless LAN, Bluetooth, and wired Internet through gateways.

However, at industrial sites, it is impossible to check a battery of each wireless sensor. At industrial sites, when a sensor does not operate appropriately due to a low battery of the sensor, safety incidents may occur. Therefore, there is a need for a solution to solve these problems.

RELATED ART DOCUMENTS

Patent Documents (Patent Document 1) Korean Patent Registration No. 10-1143343 (Apr. 30, 2012)
(Patent Document 2) Korean Patent Registration No. 10-1652461 (Aug. 24, 2016)
(Patent Document 3) Korean Patent Registration No. 10-1098042 (Dec. 16, 2011)
(Patent Document 4) Korean Patent Publication No. 10-2019-0111359 (Oct. 2, 2019)
(Patent Document 5) Korean Patent Publication No. 10-2021-0084094 (Jul. 7, 2021)
(Patent Document 6) Korean Patent Publication No. 10-2022-0007939 (Jan. 20, 2022).

DISCLOSURE

Technical Problem

An embodiment of the present invention is directed to providing a wireless sensor battery alarm system and method in which, in order to prevent malfunctions and safety incidents of workers due to battery discharge in an environment using a wireless sensor, a level of a sensor battery is measured to provide a notification function when the measured level decreases to a certain voltage or less.

Technical Solution

A sensor battery alarm system according to an embodiment of the present invention includes a wireless control device which communicates with each of a plurality of wireless sensors configured to monitor a state of any space or any equipment and receives state data related to a battery state of each wireless sensor, and a sensor monitoring device which matches the received state data to identification information of each wireless sensor to store and manage the state data, provides an error alarm to an manager terminal device configured to manage the plurality of wireless sensors, and provides a monitoring screen that allows a position of the wireless sensor in which an error has occurred to be seen when the manager terminal device selects the provided error alarm.

The wireless sensor may include a control unit of a central processing unit (CPU) or a microprocessor unit (MPU) and may measure a voltage provided to the control unit to transmit the state data to the wireless control device when an operating voltage is lower than a set voltage.

The wireless sensor may measure the voltage by measuring an amount of charges of a cross-sectional area per unit time provided from a battery unit to the control unit.

The sensor monitoring device may manage a battery state of each of the plurality of wireless sensors controlled by each wireless control device and may provide a monitoring screen to each wireless control device when the monitoring screen is provided to the manager terminal device.

The sensor monitoring device may display identification information of each wireless sensor on a screen when the monitoring screen is provided and displays whether an error has occurred through a designated color.

In addition, an alarm method of a sensor battery alarm system according to an embodiment of the present invention includes communicating, by a wireless control device, with each of a plurality of wireless sensors configured to monitor a state of any space or any equipment and receiving state data related to a battery state of each wireless sensor, and matching, by a sensor monitoring device, the received state data to identification information of each wireless sensor to store and manage the state data, providing an error alarm to an manager terminal device configured to manage the plurality of wireless sensors, and providing a monitoring screen that allows a position of the wireless sensor in which an error has occurred to be seen when the manager terminal device selects the provided error alarm.

Advantageous Effects

According to embodiments of the present invention, safety incidents at industrial sites that may occur due to malfunction of a sensor can be prevented, when a battery is low, an alarm message can be sent to a manager or user who manages a sensor to enable a quick response, and a quick response can be performed through a position alarm without having to search for a sensor with a low battery.

MODES OF THE INVENTION

Hereinafter, embodiments of the present invention will be described in detail with reference to the accompanying drawings.

Figure 1:
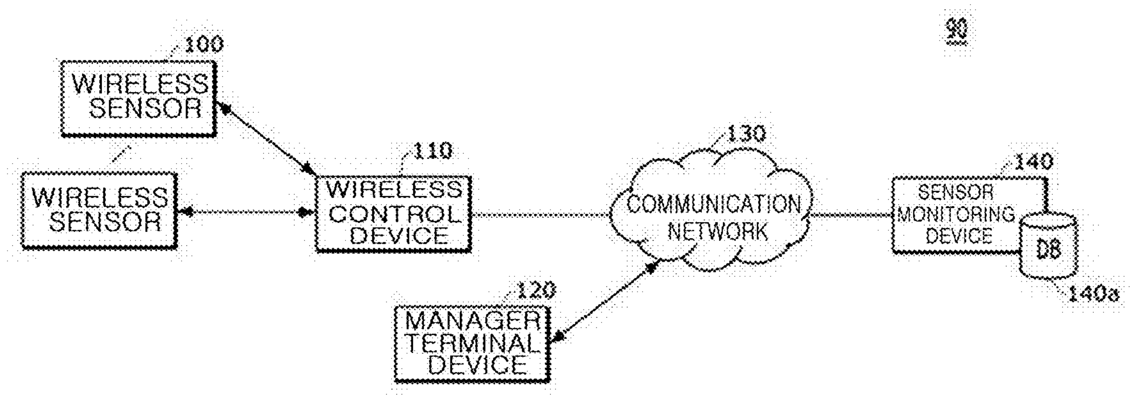
FIG. 1 is a diagram illustrating a wireless sensor battery alarm system according to an embodiment of the present invention.
Figure 2:
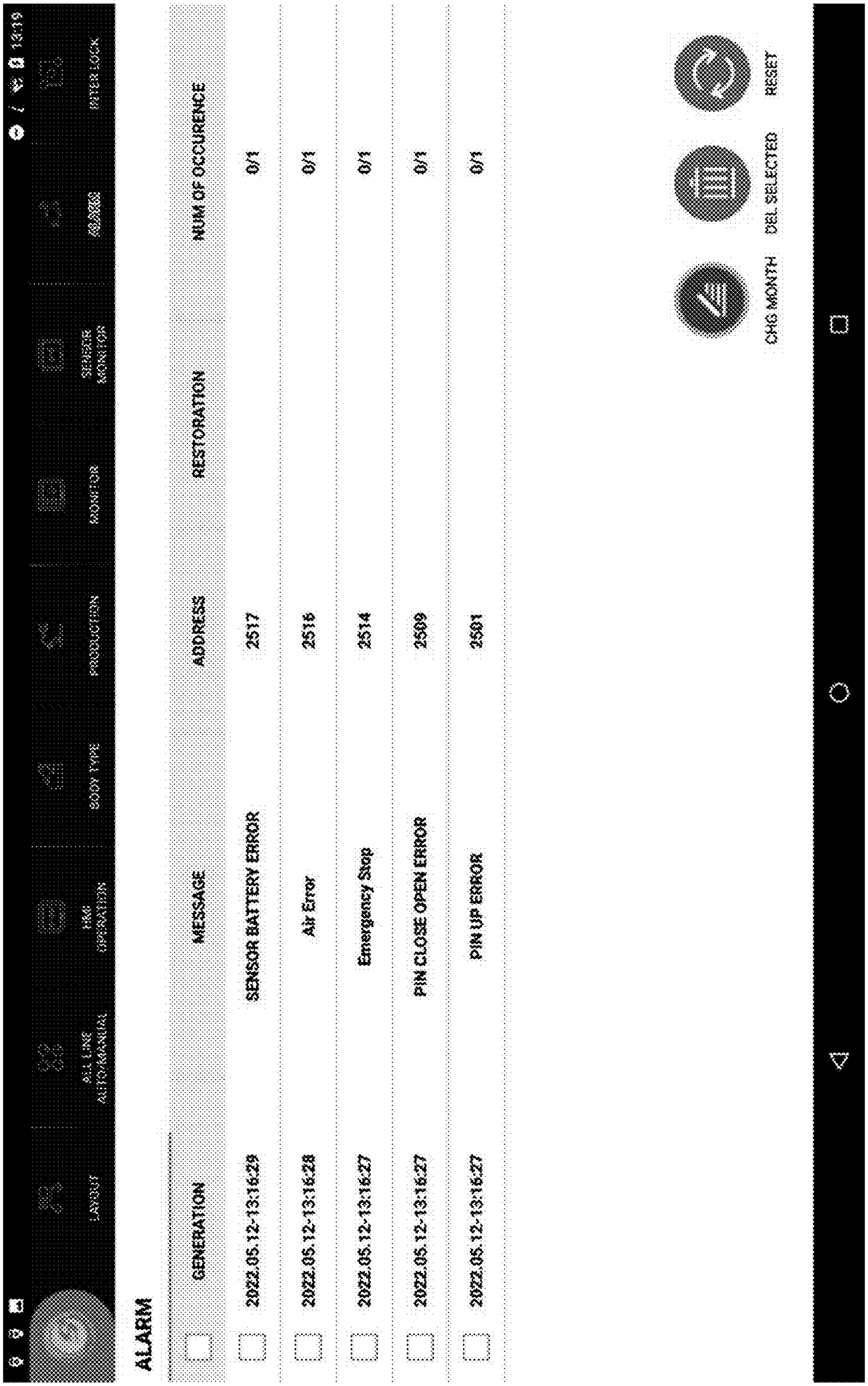
FIGS. 2 and 3 are exemplary diagrams of a sensor monitoring screen provided by a sensor monitoring device of FIG. 2.
Figure 3:
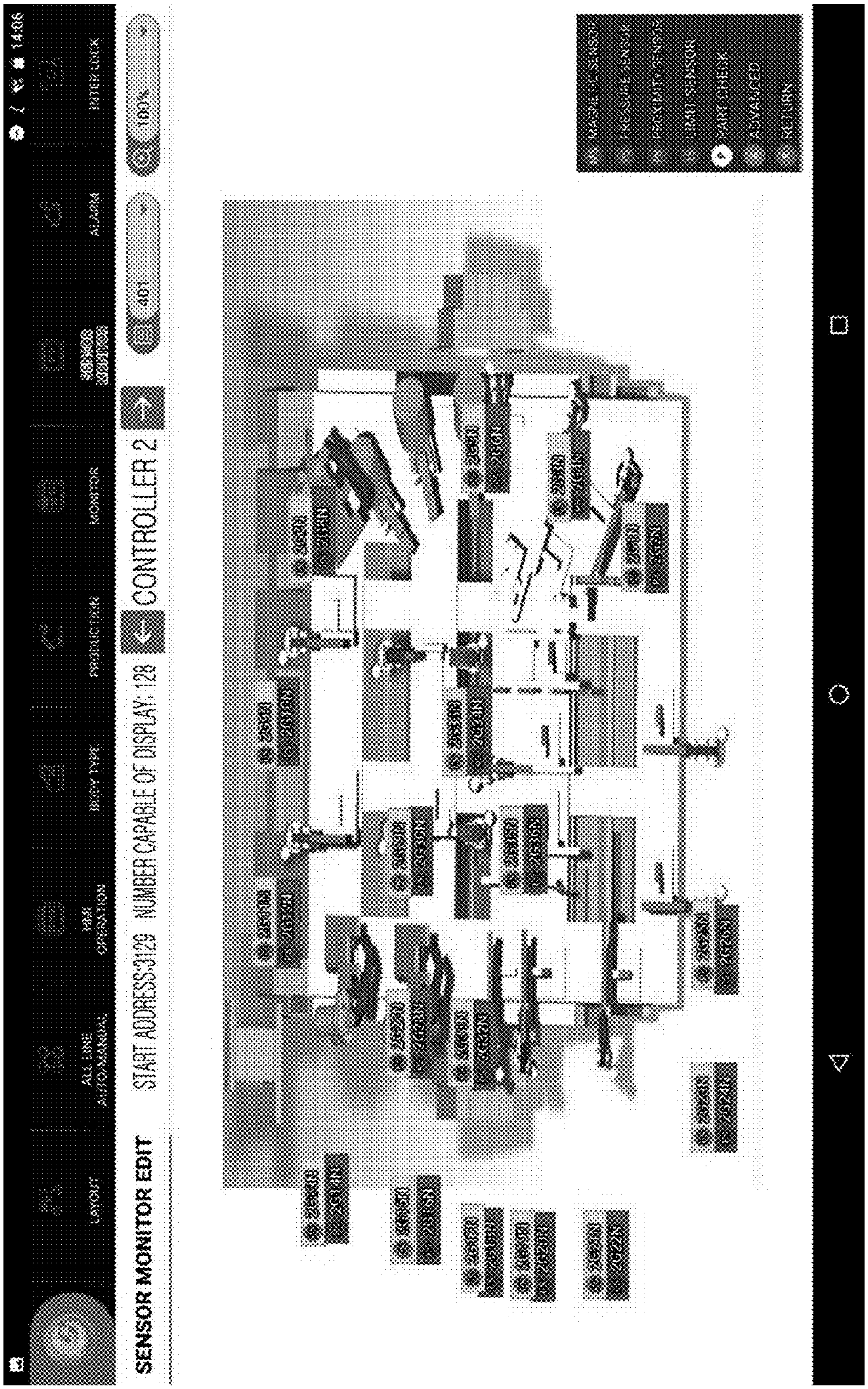

FIG. 1 is a diagram illustrating a wireless sensor battery alarm system according to an embodiment of the present invention. FIGS. 2 and 3 are exemplary diagrams of a sensor monitoring screen provided by a sensor monitoring device of FIG. 2.

As shown in FIG. 1, a wireless sensor battery alarm system 90 according to an embodiment of the present invention includes some or all of a wireless sensor 100, a wireless control device 110, a manager terminal device 120, a communication network 130, and a sensor monitoring device 140.

Here, the expression "including some or all" means that some components such as the communication network 130 are omitted so that the wireless control device 110 and the sensor monitoring device 140 may perform direct communication (for example, peer to peer (P2P) communication), or some or all components constituting the sensor monitoring device 140 may be integrated into a network device (for example, a wireless switching device) constituting the communication network 130. In order to provide a thorough understanding of the present invention, the case in which all are included will be described.

The wireless sensor 100 may be installed in or connected to any device such as a heater, a cooler, a motor, a fan, a compressor, or a pump to provide various types of sensing data related to an operating state or the like of the corresponding device (for example, heat, vibration, noise, or temperature) or may be installed in any space to detect humidity, ozone concentration, whether corona is generated, or the like to provide sensing data accordingly. Of course, corona generation due to electric discharge needs to be monitored because the corona generation causes accidents. In addition, the wireless sensor 100 according to the embodiment of the present invention may include industrial wireless sensors such as a magnetic field detection sensor, a limit sensor, and a proximity sensor. Since there are tens to tens of thousands of wireless sensors 100 in use in the marketplace, the embodiment of the present invention is not particularly limited to any one type.

The wireless sensor 100 is provided in the form of a wireless sensor module. A module may be a set of parts and may include, for example, a sensor, a central processing unit (CPU) or a microprocessor unit (MPU), a battery unit, and a wireless communication unit on a printed circuit board (PCB). Of course, the sensor senses external physical states or the like and outputs sensing signals. A sensor control unit of the CPU or MPU may perform an operation of receiving a sensing signal or sensing data from the sensor and converting the sensing signal or sensing data into digital signals. The battery unit provides a power voltage Vcc for the operations of the CPU, the MPU, the sensor, and the wireless communication unit. As the power voltage, a DC voltage may be used. The wireless communication unit transmits a sensing signal, which is obtained by converting sensing data or an analog signal of the sensor into a digital signal, to the wireless control device 110, which controls a plurality of wireless sensors 100, under the control of the sensor control unit.

The wireless sensor 100 may include a short-range communication module as a wireless communication unit, and the communication module may adopt various communication methods for short-range communication such as Bluetooth, Zigbee, Wi-Fi, or infrared communication. As short-range communication, Bluetooth communication enabling one-way or two-way communication may be preferable. The principle of Bluetooth low energy (BLE) is applied to a beacon. BLE is Bluetooth low energy and is a technology of Bluetooth 4.0 or more. As a radio communication device, a beacon transmitter periodically transmits signals. Since the beacon transmitter according to an embodiment of the present invention may perform one-way communication as well as two-way communication, the embodiment of the present invention is not particularly limited to any one method.

The wireless sensor 100 may internally measure a battery state. For example, when a measured value is a reference value or less, the wireless sensor 100 provides a state value related to the battery state to the wireless control device 110. The sensor control unit of the CPU or MPU measures a sensor battery level and determines, for example, whether the sensor battery level decreases to a certain voltage or less. That is, in sensor battery measurement, a voltage supplied to a corresponding MCU through an MPU or the like attached to or mounted on a sensor is measured, thereby checking a current battery state of the sensor. The sensor control unit may include a battery measurement unit but may operate in conjunction with a battery measurement unit provided as a peripheral circuit separately from the sensor control unit. As a voltage increases, a current increases, and since an increase in current means that the number of charges passing through a cross-sectional area per unit time increases, accordingly, a sensor battery level may be measured based on measurement of the voltage. That is, this is because a level of a battery is an amount of charges. For example, the wireless sensor 100, more precisely, the sensor control unit, may constitute a resistor having a specified value between a connection line connected to the battery unit and, for example, a ground GND, and may sense a voltage across two terminals of the resistor, thereby measuring a level of a battery.

The wireless control device 110 communicates with the plurality of wireless sensors 100 and also operates as a communication receiver that controls the plurality of wireless sensors 100 in an any area. According to an embodiment of the present invention, the plurality of wireless control devices 110, that is, N wireless controllers, may be constructed and used. In this case, each wireless control device 110 may receive sensing data from wireless sensors 100 of different groups to transmit the sensing data to the sensor monitoring device 140 of FIG. 1. The number of wireless sensors 100 controlled by each wireless control device 110 may be limited to about 128 to ensure smooth communication. Of course, since the number of wireless sensors 100 is related to the performance of the wireless control device 110, the number is not particularly limited.

When the wireless sensor battery alarm system 90 of FIG. 1 according to the embodiment of the present invention is constructed, the wireless control device 110 may prestore a list of the wireless sensors 100 capable of communicating in a memory such as a hardware random access memory (RAM) or a software registry. Accordingly, based on the stored list, the wireless control device 110 communicates with the wireless sensor 100 that corresponds to a control area thereof, and provides sensing data. For example, the wireless sensor 100 transmits a state value related to a battery state thereof when a battery state is a reference value or less. In this case, the wireless sensor 100 also transmits device identification (ID) information. Accordingly, the wireless control device 110 may process received sensing data when corresponding ID information matches ID information in the prestored list.

The manager terminal device 120 is a user terminal device of a manager who manages a wireless sensor installed in any space or any device. The manager terminal device 120 includes a mobile-based mobile terminal device such as a smartphone, a tablet personal computer (PC), or a wearable device worn on a wrist and may include a PC-based terminal device such as a desktop computer or a laptop computer. The manager terminal device 120 may be equipped with an application (hereinafter, "app") according to an embodiment of the present invention and execute the app, thereby confirming, for example, screens as shown in FIGS. 2 and 3. FIG. 2 is a diagram showing a battery error alarm in an app alarm list. When an ALARM item at an upper end portion of a screen is selected, error alarm content may be displayed on the screen. FIG. 3 is a screen that displays a low battery error and a position notification on an app sensor monitor screen as a position display screen. Of course, the screens in FIGS. 2 and 3 may be screens displayed on a computer of a manager, a status board, or an electronic display board connected to the sensor monitoring device 140. In this case, since an operation may be performed in the form in which ID information of a specific wireless sensor 100 is transmitted to the manager terminal device 120, the embodiment of the present invention is not particularly limited to any one form. Of course, a configuration in which the same screen is viewed on the computer of the manager and the manager terminal device 120 may also be possible.

The manager terminal device 120 reads a battery state value stored in a database (DB) 140*a* from a programmable logic controller (PLC) such as the sensor monitoring device 140 of FIG. 1 and displays a battery error alarm on a screen when even one sensor has a low battery. In addition, the manager terminal device 120 may display that an error has occurred in the wireless sensor 100 controlled by the controller 2 among the wireless control devices 110 of FIG. 1 as shown in FIG. 3. A total of 128 wireless sensors 100 controlled by the controller 2 may be displayed on a map. Here, when the wireless sensor 100 is disposed inside a building, the map may be preferably an internal structure map of the building through which an internal structure of the building and a position of the wireless sensor 100 may be identified. As shown in FIG. 3, a red mark indicates a sensor with a low battery. When a battery error alarm (item) in the alarm list of FIG. 2 is clicked, a page is moved to a page through which a sensor position may be identified as shown in FIG. 3. The manager terminal device 120 displays a sensor with a low battery on a sensor monitoring screen so that a manager may immediately identify a position of the sensor.

The communication network 130 includes both wired and wireless communication networks. For example, a wired or wireless Internet network may be used or connected to the communication network 130. Here, the wired network includes an Internet network such as a cable network or a public switched telephone network (PSTN), and the wireless communication network includes code division multiple access (CDMA), wideband code division multiple access (WCDMA), Global System/Standard for Mobile Communication (GSM), evolved packet core (EPC), Long Term Evolution (LTE), or a Wireless Broadband Internet (Wibro) network. Of course, the communication network 130 according to the embodiment of the present invention is not limited thereto and may be used as an access network of a next-generation mobile communication system to be implemented in the future, for example, a cloud computing network under a cloud computing environment, a 5G network, or the like. For example, when the communication network 130 is a wired communication network, an access point within the communication network may be connected to an exchange of a telephone office or the like, but when the communication network 130 is a wireless communication network, the communication network 130 may be connected to a Serving GPRS Support Node (SGSN) or Gateway GPRS Support Node (GGSN) operated by a communication company to process data or may be connected to various relays such as a base transceiver station (BTS), NodeB, or e-NodeB to process data.

The communication network 130 may also include an access point. The access point includes a small base station such as a femto or pico base station which is widely installed inside buildings. Here, according to classification of small base stations, the femto or pico base station is classified according to how many wireless control devices 110 or manager terminal devices 120 may be connected thereto. Of course, the access point includes a short-range communication module for performing short-range communication such as Zigbee and Wi-Fi with the wireless control device 110 or the manager terminal device 120. The access point may use a transmission control protocol/Internet protocol (TCP/IP), a real-time streaming protocol (RTSP), or the like for wireless communication. Here, the short-range communication may be performed through various specifications such as Bluetooth, Zigbee, Infrared Data Association (IrDA), radio frequency (RF) communication such as ultra-high frequency (UHF) or very high frequency (VHF) communication, and ultra-wideband communication (UWB) in addition to Wi-Fi. Accordingly, the access point may extract a position of a data packet, may designate an optimal communication path for the extracted position, and may transmit the data packet to a next device, for example, the sensor monitoring device 140, along the designated communication path. The access point may share a plurality of lines in a typical network environment and may include, for example, a router, a repeater, and a relay.

The sensor monitoring device 140 manages an operating state of the wireless sensors 100 installed in any space or any equipment. To this end, based on ID information of the wireless control device 110, the sensor monitoring device 140 manages the plurality of wireless sensors 100 controlled by each wireless control device 110. That is, a first wireless control device, which is controller 1, may control sensors 1 to 128, and a second wireless control device, which is controller 2, may manage an operating state of sensors 129 to 257. Of course, each wireless sensor 100 has device ID information, but since it is also possible for the sensor monitoring device 140 to separately assign a number to manage each wireless sensor 100, the embodiment of the present invention is not particularly limited to any one form.

When a state value is transmitted from controller 1 to have the wireless sensor 100 assigned, for example, number 50, to indicate that a remaining battery level is insufficient, the sensor monitoring device 140 may classify and store the state value in the DB 140*a* of FIG. 1. The sensor monitoring device 140 may notify the manager terminal device 120 of such a fact. In such a process, the sensor monitoring device 140 transmits an error alarm to the manager terminal device 120, adds the error alarm to an error alarm history, and provides a sensor monitor page when a manager clicks a battery alarm in the error alarm history. Here, in an alarm notification process, various forms of notification are possible. Rather than notifying of an error when an error occurs in each wireless sensor 100, that is, whenever a battery is low, by periodically notifying through an alarm at a certain time interval, the number of times a manager is notified of an alarm is reduced, thereby increasing monitoring efficiency.

Above all, in order to further increase the monitoring efficiency of the wireless sensors 100, the sensor monitoring device 140 may further determine an effect on a low battery by further determining an additional state such as an error occurrence frequency or an operating state of the wireless sensors 100. For example, when an error occurrence frequency is high, it is possible to request replacement of the wireless sensor 100. In addition, when the wireless sensor 100 is severely overheated or is an old model, a battery may be quickly discharged due to product degradation. Accordingly, the sensor monitoring device 140 applies an artificial intelligence program, collects data related to the operation or low battery of the wireless sensor 100, generates big data, and applies a deep learning operation of the artificial intelligence program to the big data to proactively respond to a low battery or a failure of the wireless sensor 100, thereby preventing malfunctions and safety incidents of workers due to battery discharge in an environment in which the wireless sensor 100 is used. For example, when the wireless sensor 100 of a specific manufacturer is heated, the sensor monitoring device 140 may check a name of the manufacturer based on current data learning results. When there is a failure history in the wireless sensor 100 of the manufacturer, the failure history may be provided to the manager terminal device 120 to enable prompt replacement.

Meanwhile, the sensor monitoring device 140 may appropriately respond even when the wireless control device 110 operates abnormally. For example, the sensor monitoring device 140 determines whether data of the wireless sensor 100 is received from a designated wireless control device 110. Of course, when there is no sensor having a low battery among the wireless sensors 100 controlled by a specific wireless control device 110, the sensor monitoring device 140 may not receive data for a specified time. Accordingly, the sensor monitoring device 140 learns such an operating state. Based on results of the learning, the sensor monitoring device 140 may determine whether the wireless control device 110 is abnormal through an operating pattern of the wireless sensor 100 controlled by the specific wireless control device 110. In addition, if not learning by applying an artificial intelligence program, when there is no sensing data received for a certain time, the sensor monitoring device 140 may transmit a test signal for checking whether an operation is abnormal to the wireless control device 11, and when there is no response signal, the sensor monitoring device 140 may determine that the operation is abnormal and may take action to repair or replace the wireless control device 110 through the manager terminal device 120.

Figure 4:
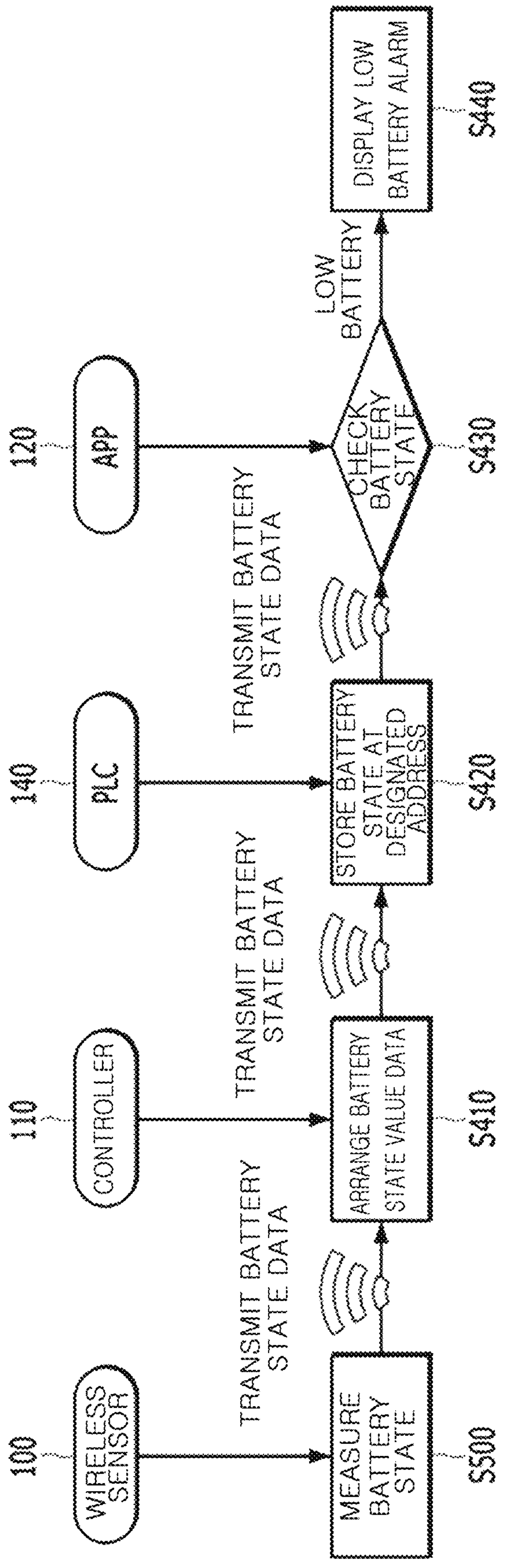
FIGS. 4 and 5 are diagrams illustrating a wireless sensor battery alarm process.
Figure 5:
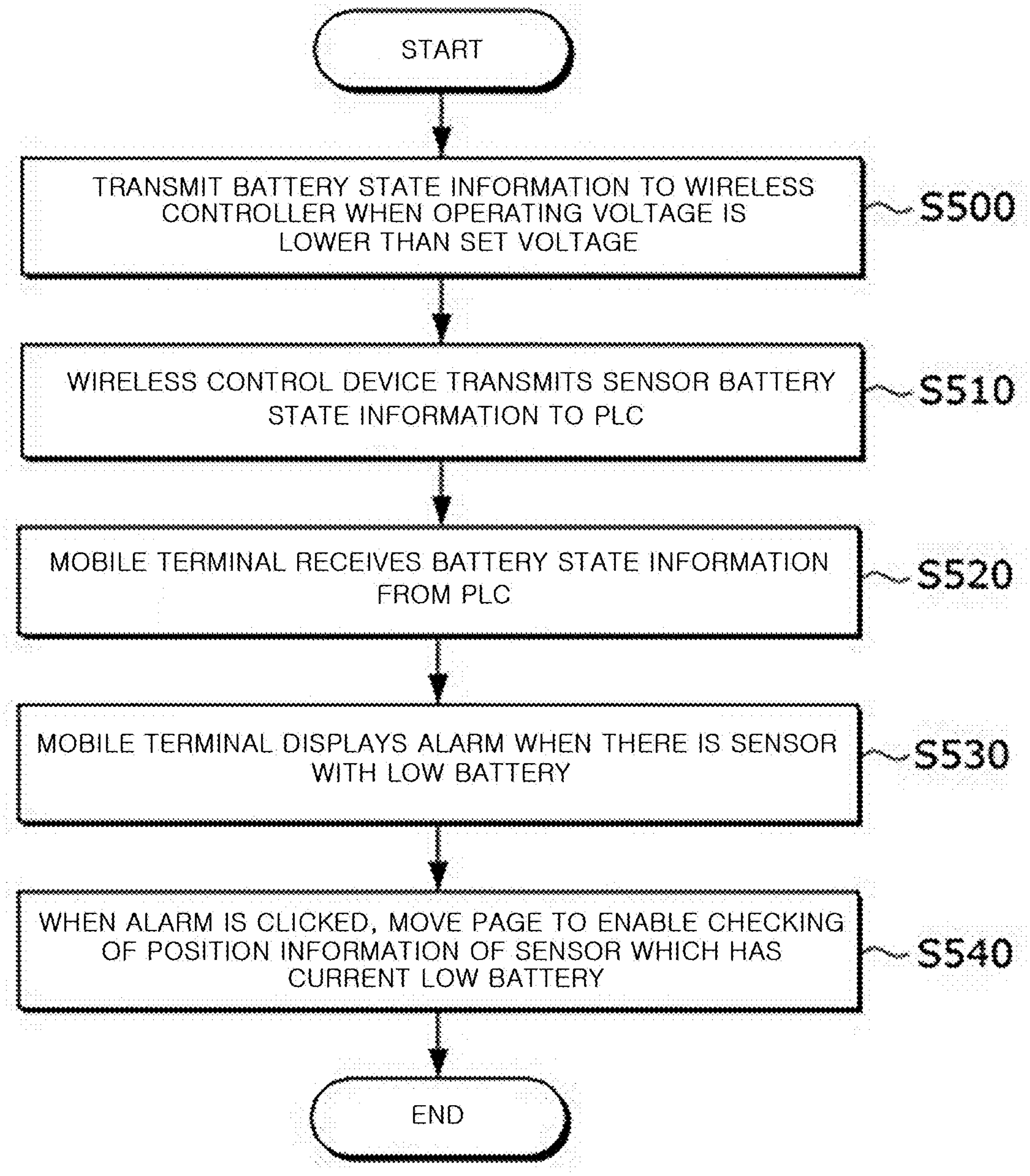

FIGS. 4 and 5 are diagrams illustrating a wireless sensor battery alarm process.

As shown in FIGS. 4 and 5, the wireless sensor 100 measures a battery state and transmits state value data related to the battery state to a controller, that is, the wireless control device 110 (S400). Accordingly, the wireless control device 110 arranges battery state value data (S410). The wireless control device 110 matches a battery state value for each wireless sensor 100 to temporarily store the battery state value in a memory and then transmits the battery state value to a PLC, that is, the sensor monitoring device 140 of FIGS. 1 (S410 and S510).

As can be seen in FIG. 5, in the embodiment of the present invention, when an operating voltage is lower than a set voltage, the wireless sensor 100 transmits battery state information to a wireless controller, that is, the wireless control device 110 (S500). The battery state information acquired by measuring a voltage may be obtained by measuring a voltage across both ends of a resistor having a resistance value of a specified size.

The sensor monitoring device 140 stores a battery state at a designated address (S420). Here, the address may be address information through which a space of the DB 140*a* of FIG. 1 in which the data is stored may be known. ID information of the wireless control device 110 and ID information and battery state values of the wireless sensors 100 matched thereto may be matched and stored in the address.

The sensor monitoring device 140 transmits data for checking a battery state to the manager terminal device 120. Accordingly, the manager terminal device 120 may check the battery state (S430 and S520). When a battery is low, an automatic notification may be provided through an app of the manager terminal device 120 so that the manager terminal device 120 displays a low battery alarm on a screen.

The manager terminal device 120 displays an alarm when there is a sensor with a low battery, and when the alarm is clicked, the manager terminal device 120 operates to move a page to enable checking of position information of a sensor which has a current low battery (S530 and S540). The screen may be displayed as shown in FIG. 3.

In addition to the above-described content, the wireless sensor 100, the wireless control device 110, the manager terminal device 120, and the sensor monitoring device 140 of FIG. 1 may perform various operations, and since other detailed content has been sufficiently described above, description thereof is replaced with the above-described content.

Figure 6:
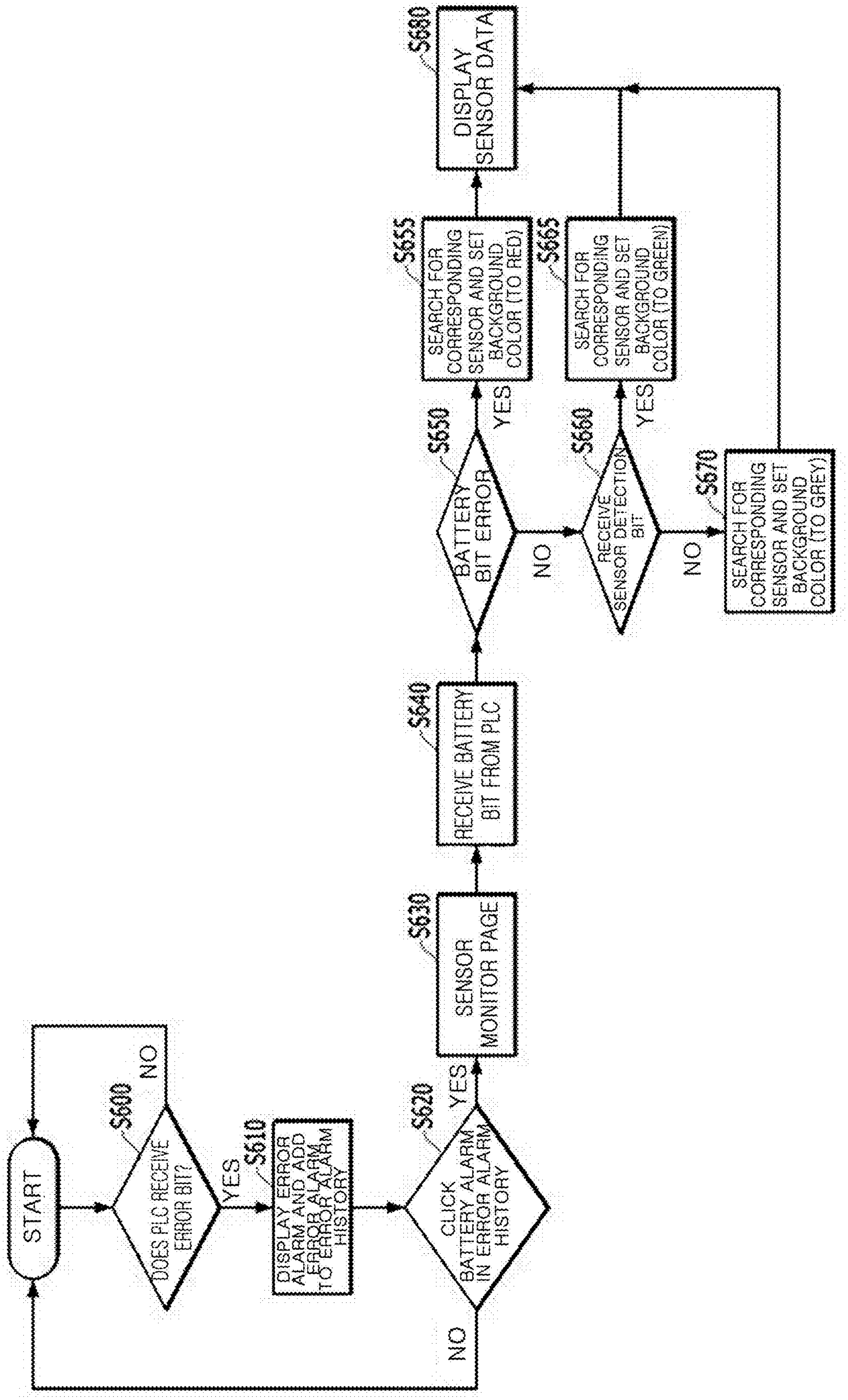
FIG. 6 is a flowchart illustrating an operation process of a manager terminal device of FIG. 1.

FIG. 6 is a flowchart illustrating an operation process of a manager terminal device of FIG. 1.

For convenience of description, referring to FIG. 6 together with FIG. 1, the manager terminal device 120 of FIG. 1 according to the embodiment of the present invention is a mobile terminal device such as a smartphone and receives an error bit from the sensor monitoring device 140 of FIG. 1 (S600). Of course, the error bit may include error information of the wireless sensor 100.

Then, the manager terminal device 120 displays an error alarm on a screen and adds the error alarm to an error alarm history (S610). For example, when a battery state of a specific wireless sensor 100 is not displayed in the alarm history, the wireless sensor 100 may be added to a list.

When a manager of the manager terminal device 120 clicks a battery alarm in the error alarm history, the manager terminal device 120 (or the sensor monitoring device 140) transmits a sensor monitor page (S620 and S630). Of course, such a page may also be generated through a GPU card or GPU program in the manager terminal device 120.

In this case, the manager terminal device 120 receives a battery bit from the sensor monitoring device 140 (S640). That is, battery error information, that is, error data, is received.

When there is a battery bit error in a specific wireless sensor 100, the manager terminal device 120 searches for the wireless sensor 100 and sets a background color to red. The background color is displayed in red on a screen of the manager terminal device 120 (S650 and S655).

In addition, when there is no battery bit error in the specific wireless sensor 100, the manager terminal device 120 may search for a corresponding sensor and set the background color to green or gray according to whether a sensor detection bit is received (S660, S665, and S670). For example, when the sensor detection bit is received, the background color may be set to green, and when the sensor detection bit is not received, the background color may be set to gray.

In addition to the above-described content, the manager terminal device 120 of FIG. 1 may perform various operations, and since other detailed content has been sufficiently described above, description thereof is replaced with the above-described content.

Although all elements constituting the embodiments of the present invention are described as being combined into one or combined to operate, the present invention is not necessarily limited to the embodiments. That is, within the objective scope of the present invention, the respective components may be selectively and operatively combined as one or more components. In addition, each component may be embodied as one independent piece of hardware. However, some or all of the components may be selectively combined to be embodied as a computer program having a program module performing some or all functions combined in one or more pieces of hardware. Codes and code segments configuring the computer program may be easily inferred by those skilled in the art. The computer program may be stored on a non-transitory computer readable medium, and read and executed by a computer to embody embodiments of the present invention.

Here, the non-transitory computer readable medium is a medium which does not store data temporarily such as a register, cash, and memory but stores data semi-permanently and is readable by devices. Specifically, the above-described programs may be stored in a non-transitory computer readable medium such as compact disks (CDs), digital video disks (DVDs), hard disks, Blu-ray disks, universal serial buses (USBs), memory cards, and read-only memories (ROMs).

Although exemplary embodiments of the present invention have been shown and described, the present invention is not limited to the above-described specific embodiments, but it should be understood by those skilled in the art that various modifications and variations are possible without departing from the subject matter of the disclosure claimed by the accompanying claims. In addition, the modifications and variations should not be understood based on the technical spirit or prospects of the present invention.

The invention claimed is:

1. A sensor battery alarm system comprising:

a plurality of wireless control devices which communicates with each of a plurality of wireless sensors configured to monitor a state of any space or any equipment and receives state data related to a battery state of each wireless sensor; and a sensor monitoring device which matches the received state data to identification information of each wireless sensor to store and manage the state data, provides an error alarm to a manager terminal device configured to manage the plurality of wireless sensors, and provides a monitoring screen through which a position of the wireless sensor in which an error has occurred is identified when the manager terminal device selects the provided error alarm, wherein the sensor monitoring device manages the battery state of each of the plurality of wireless sensors controlled by each wireless control device and provides monitoring screens for respective wireless control devices when the monitoring screens are provided to the manager terminal device, wherein the sensor monitoring device displays the identification information of each wireless sensor on the monitoring screen and indicates whether the error has occurred using a designated color, wherein the sensor monitoring device further determines an effect on a low battery by further determining an additional state including an error occurrence frequency or an operating state of the wireless sensor, requests replacement of the wireless sensor when the error occurrence frequency is high, and determines battery discharge due to product degradation of the wireless sensor, wherein the manager terminal device, when a battery alarm item in an alarm list is clicked, moves to a page and displays, on a map through which positions of the plurality of wireless sensors are identified, all of the plurality of wireless sensors controlled by one wireless control device, and wherein, when the wireless sensor is disposed inside a building, the manager terminal device displays the map as an internal structure map of the building through which an internal structure of the building and the position of the wireless sensor are identified.

2. The sensor battery alarm system of claim 1, wherein the wireless sensor includes a control unit of a central processing unit (CPU) or a microprocessor unit (MPU) and measures a voltage provided to the control unit to transmit the state data to the plurality of wireless control devices when an operating voltage is lower than a set voltage.

3. The sensor battery alarm system of claim 2, wherein the wireless sensor measures the voltage by measuring an amount of charges of a cross-sectional area per unit time provided from a battery unit to the control unit.

4. An alarm method of a sensor battery alarm system, comprising:

communicating, by a plurality of wireless control devices, with each of a plurality of wireless sensors configured to monitor a state of any space or any equipment and receiving state data related to a battery state of each wireless sensor; and matching, by a sensor monitoring device, the received state data to identification information of each wireless sensor to store and manage the state data, providing an error alarm to a manager terminal device configured to manage the plurality of wireless sensors, and providing a monitoring screen through which a position of the wireless sensor in which an error has occurred is identified when the manager terminal device selects the provided error alarm;

managing, by the sensor monitoring device, the battery state of each of the plurality of wireless sensors controlled by each wireless control device and providing monitoring screens for respective wireless control devices when the monitoring screens are provided to the manager terminal device;

displaying, by the sensor monitoring device, the identification information of each wireless sensor on the monitoring screen and indicating whether the error has occurred using a designated color;

further determining, by the sensor monitoring device, an effect on a low battery by further determining an additional state including an error occurrence frequency or an operating state of the wireless sensor, requesting replacement of the wireless sensor when the error occurrence frequency is high, and determining battery discharge due to product degradation of the wireless sensor;

moving, by the manager terminal device, to a page and displaying, on a map through which positions of the plurality of wireless sensors are identified, all of the plurality of wireless sensors controlled by one wireless control device when a battery alarm item in an alarm list is clicked; and displaying, by the manager terminal device, the map as an internal structure map of the building through which an internal structure of the building and the position of the wireless sensor are identified when the wireless sensor is disposed inside a building.

* * * * *